United States Patent

Chung et al.

[11] Patent Number: 6,122,194
[45] Date of Patent: Sep. 19, 2000

[54] SEMICONDUCTOR MEMORY DEVICE WITH A COLUMN REDUNDANCY OCCUPYING A LESS CHIP AREA

[75] Inventors: Hwi-Taek Chung, Kyunggi-do; Jong-Min Park, Suwon, both of Rep. of Korea

[73] Assignee: Samsung Electronics, Co., Ltd., Suwon, Rep. of Korea

[21] Appl. No.: 09/491,846

[22] Filed: Jan. 26, 2000

Related U.S. Application Data

[63] Continuation of application No. 09/222,039, Dec. 29, 1998.

[30] Foreign Application Priority Data

Dec. 29, 1997 [KR] Rep. of Korea ............... 97-77266

[51] Int. Cl.$^7$ .................................. G11C 16/06
[52] U.S. Cl. ............ 365/185.09; 365/200; 365/185.11; 371/10.3
[58] Field of Search ............... 365/185.09, 200, 365/185.17, 185.11; 371/10.2, 10.3

[56] References Cited

U.S. PATENT DOCUMENTS 5,270,974 12/1993 Reddy ........................... 365/200
5,691,945 11/1997 Liou et al. .................. 365/185.09 X

*Primary Examiner*—Huan Hoang
*Attorney, Agent, or Firm*—Marger Johnson & McCollom, P.C.

[57] ABSTRACT

A semiconductor memory device is provided which comprises a mat having a plurality of sectors for storing information of data; and a redundancy circuit for generating a plurality of redundancy selection signals to be applied in common to the sectors when the enable fuse element is open-circuited. Each of the sectors comprises a main memory cell array and the redundancy memory cell array divided into two redundant bit segments, each of which has two redundant columns of redundant memory cells. Each sector further comprises a first column selector for selecting one of the main columns of each bit segment in response to first column address signals; a second column selector for selecting one of the two redundant columns of each redundant bit segment in response to one of the first column address signals; and a third column selector for selecting one of the two bit segments in each input/output block and one of the two redundant bit segments in response to second column address signals. Furthermore, each sector has a plurality of sense amplifiers for sensing and amplifying stored data in corresponding main column and; redundant column thus selected; and a plurality of multiplexers each for receiving outputs from a first corresponding sense amplifier and from the second sense amplifier and selecting one of the outputs thus received in response to a corresponding redundancy selection signal.

2 Claims, 10 Drawing Sheets

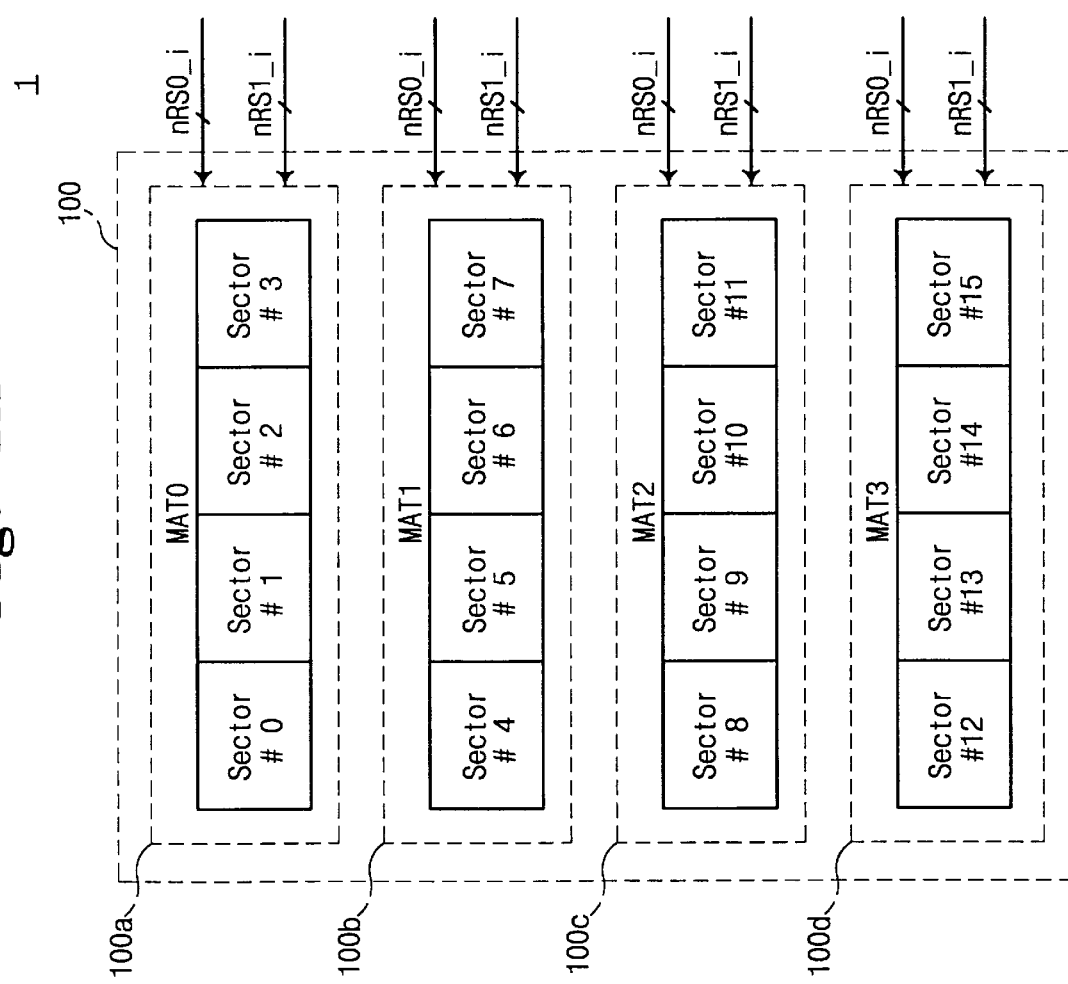

SEMICONDUCTOR MEMORY DEVICE WITH A COLUMN REDUNDANCY OCCUPYING A LESS CHIP AREA

This application is a continuation of U.S. patent application Ser. No. 09/222,039, filed Dec. 29, 1998.

FIELD OF THE INVENTION

The present invention relates to a semiconductor memory device and, more particularly to a semiconductor memory device with a new redundancy architecture occupying a less chip area, which can repair two defective columns by use of information indicating one of the defective columns.

BACKGROUND OF THE INVENTION

A semiconductor device includes a large number of memory cells arranged along rows and columns which are orthogonal to each other. The density of defects generated in such a semiconductor memory device during manufacturing is relatively independent of the integration density of the device, but is dependent on the semiconductor manufacturing technology. The higher the integration density of the device,. The greater is the ration of the number of normal memory cells to that of defective memory cells. Even if the device, however, includes only one defective memory cell therein, the device cannot operate normally, and therefore, the device is abandoned (or discarded).

In order to be able to operate a semiconductor device despite such a defective memory cell, a semiconductor memory device incorporates a redundant memory cell array in the main memory cell array along the rows and columns. In a semiconductor memory device including such a redundancy memory cell array, the manufacturing yield can be improved.

The semiconductor memory device which comprises flash electrically erasable programmable read-only memory cells has an array divided into plural mats. Hereinafter, such a semiconductor memory device is named a flash memory device. Each mat of the flash memory device is divided into a plurality of sectors, each of which is an erase unit as well known to ones of ordinary skill in the art. In each sector, there is provided a main memory cell array of a first plurality of columns (referred to as "a main column" or "a main bit line") of main memory cells and a redundancy memory cell array of a second plurality of columns (or redundant columns) of redundant memory cells. In the flash memory device, there is incorporated a circuit for replacing a first column of at least one defective memory cell (or a defective column of memory cells) with a second column of redundant memory cells. Hereinafter, such a circuit is named a redundancy circuit. Since the redundancy circuit is provided in the prior flash memory device on the basis of each sector, the redundancy circuit thus incorporated therein occupies a large amount of an integrated circuit chip region. As a result, it results in a reduction of a chip efficiency.

As the integration density of the device becomes high, a minimum feature size may be reduced more and more, particularly in a memory cell array. For this, such a possibility that the first columns adjacent to each other can be short-circuited may become by far much. In the prior flash memory device, however, it is general a redundancy scheme that only one column of defective memory cells is repaired by means of only one address information indicating the column of the defective memory cells. Therefore, when two columns of main memory cells are short-circuited, address information corresponding to the two columns have to be stored in corresponding redundancy circuit is, respectively. This also results in a reduction of a chip efficiency.

Accordingly, it is needed a new redundancy architecture capable of repairing two adjacent columns thus short-circuited to each other by use of only one address information.

SUMMARY OF THE INVENTION

It is therefore an object of the present invention to provide a semiconductor memory device having a column redundancy structure capable of improving a chip efficiency.

It is another object of the invention to provide a semiconductor memory device capable of repairing two defective columns by use of information indicating one of the defective columns.

In order to attain the above objects, according to an aspect of the present invention, there is provided a semiconductor memory device which comprises a mat having a plurality of sectors for storing information of data; and a redundancy circuit having at least one enable fuse element for indicating whether a defective main column in at least one of the sectors is present, for generating a plurality of redundancy selection signals to be applied in common to the sectors when the enable fuse element is open-circuited, the redundancy selection signals each corresponding to a plurality of input/output pins of the device. Each of the sectors has a) a main memory cell array divided into plural input/output blocks, each of which corresponds to the input/output pins and has two bit segments of main columns of main memory cells; b) the redundancy memory cell array divided into two redundant bit segments, each of which has two redundant columns of redundant memory cells; c) a first column selector for selecting one of the main columns of each bit segment in response to first column address signals; d) a second column selector for selecting one of the two redundant columns of each redundant bit segment in response to one of the first column address signals, the one address signal indicating a least-significant bit of the first column addresses; e) a third column selector for selecting one of the two bit segments in each input/output block and one of the two redundant bit segments in response to second column address signals; f) a first plurality of sense amplifiers each corresponding to the input/output blocks, each for sensing and applying stored data in corresponding input/output block through the main column thus selected; g) a second sense amplifier for sensing and amplifying stored data in the selected redundant bit segment through the redundant column thus selected; and h) a plurality of multiplexers each coupled to the input/output pins, each for receiving outputs from a first corresponding sense amplifier and from the second sense amplifier and selecting one of the outputs thus received in response to a corresponding redundancy selection signal.

According to the present invention, first, an operation of repairing defective columns of main memory cells is made on the basis of one mat instead of one sector as a repair unit in order to reduce a chip area occupied by integrated circuits related to a redundancy. By use of such a repair scheme, when a defective column is detected in one of sectors in a mat, the others therein are also repaired in connection with the one sector. Such a repair scheme is useful when each sector has same defective columns. Second, a semiconductor memory device of the present invention is capable of repairing two main columns adjacent to each other by using column address information indicative of one of the two main columns.

BRIEF DESCRIPTION OF THE DRAWINGS

FIG. 1 including FIGS. 1A and 1B shows a block diagram of a semiconductor memory device according to the present invention;

DESCRIPTION OF THE PREFERRED EMBODIMENTS

<A PREFERRED EMBODIMENT>

Hereinafter, the preferred embodiment of the present invention having the aforementioned feature will be described with reference to the accompanying drawings.

The present invention will be expressed by a flash memory device, particularly a nor-type flash memory device having flash EEPROM cells. However, it is obvious to ones of ordinary skill in the art that the spirit of the present invention is capable of being applied to other types of memory devices.

Figure 1B:
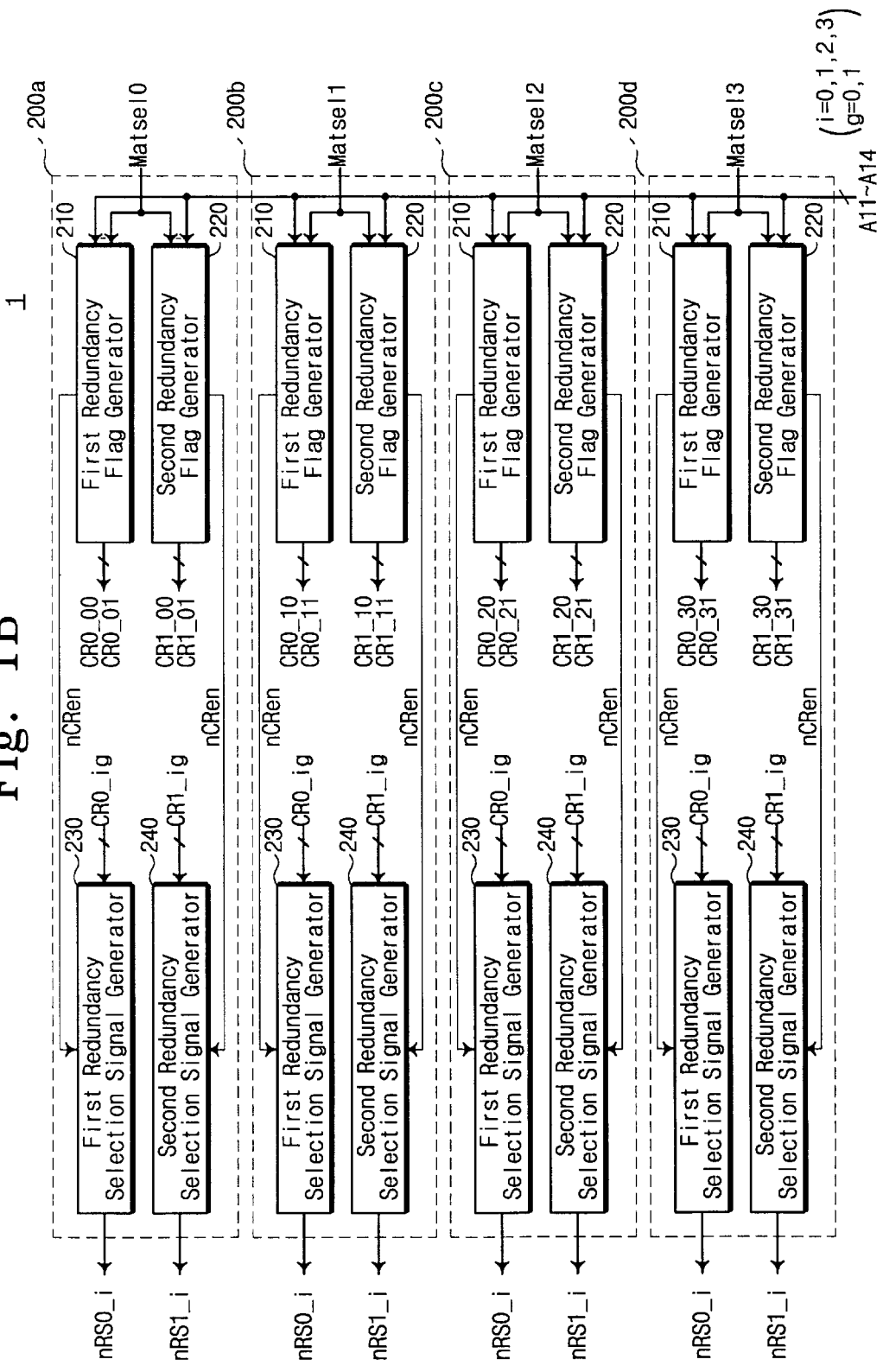

Referring first to FIG. 1, a flash memory device 1 according to the present invention is illustrated. An array 100 of a plurality of, for example, four mats 100a, 100b, 100c, and 100d is provided in the flash memory device 1. Each of the mats 100a, 100b, 100c, and 100d is comprised of, for example, four sectors, each of which has a plurality of main memory cells (that is, flash EEPROM cells) arranged in rows and columns (not shown). The sectors have a main memory cell array of the main memory cells and a redundancy memory cell array of redundancy memory cells for replacing at least one columns having faulty cell(s) in a main memory cell array, respectively.

As illustrated in FIG. 1, redundancy selection circuits 200a, 200b, 200c, and 200d are implemented so as to correspond to the respective mats 100a, 100b, 100c, and 100d. Each of the redundancy selection circuits 200a, 200b, 200c, and 200d is selected when corresponding mat selection signal Matseli (i=0, 1, 2, 3) is activated. Then the redundancy selection circuit thus selected outputs a first plurality of redundancy selection signals nRS0_i (i=0–15) and a second plurality of redundancy selection signals nRS1_i. Herein, a symbol n attached to the respective signals means that each signal becomes a low level as its enabled state. The redundancy selection circuits 200a, 200b, 200c, and 200d corresponding to the respective mats 100a, 100b, 100c, and 100d will be detailed below with reference to FIGS. 3 through 7.

It is one of the most important feature that the respective redundancy selection circuits 200a–200d, that is, redundancy circuits, are not provided on the basis of the respective sectors, but on the basis of the respective mats 100a–100d. For this reason, the flash memory device 1 made according to the latter is capable of having a more improved chip efficiency than the former. That is, in a case of the latter, the redundancy selection circuits occupies less chip area than the former.

Figure 2:
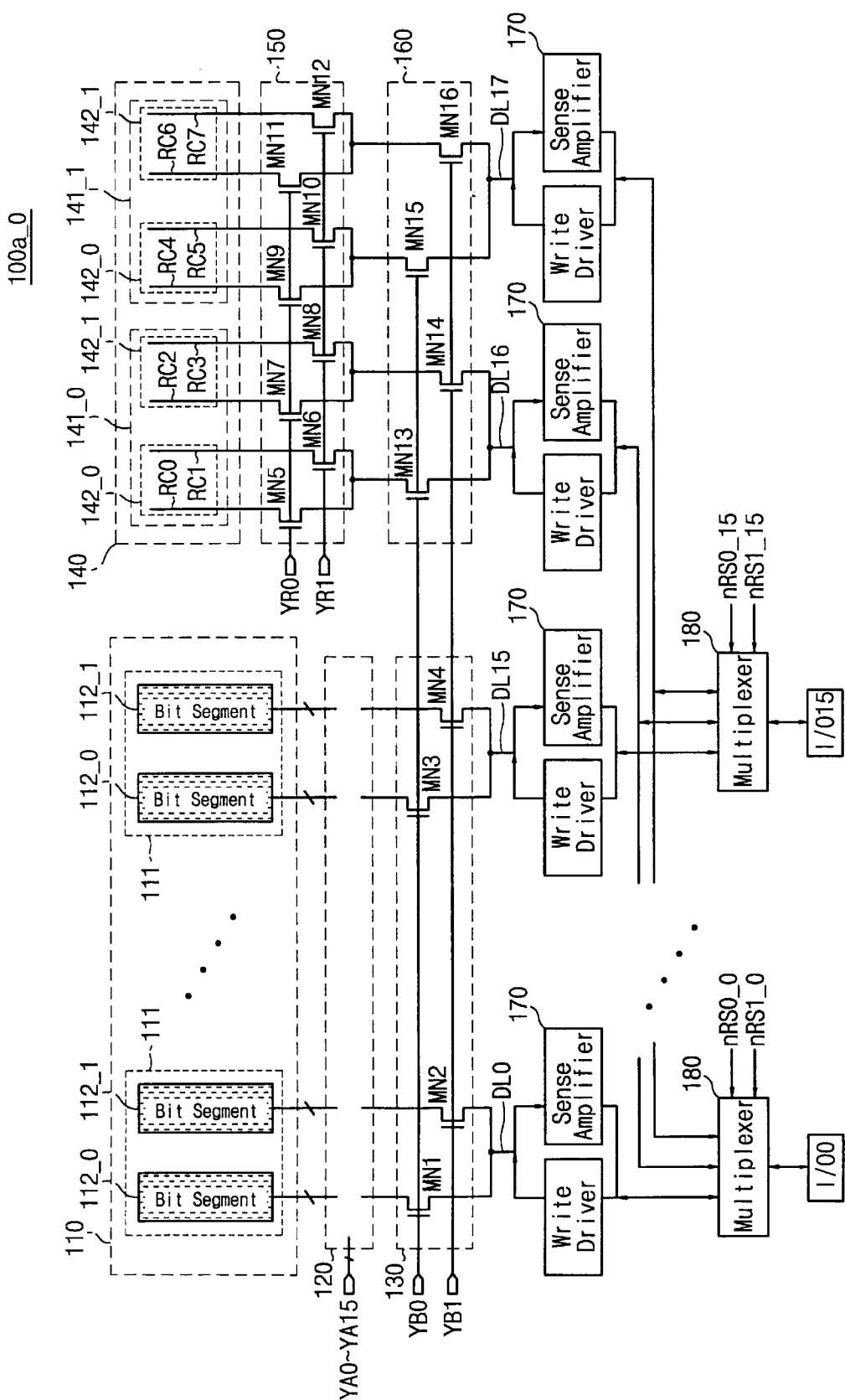
FIG. 2 shows a circuit block diagram of one sector according to a preferred embodiment of the present invention.

For the ease of description, constituent elements associated with only one sector (for example, #0) in a mat (for example, 100a) of FIG. 1 are illustrated in FIG. 2, but other selectors (for example, #1–#3) therein also have the same constituent elements as the one selector #0. Sectors in the other mats 100b, 100c, and 100d are also configured equally to that.

In FIG. 2, the sector 100a–d has a main memory cell array 110, which comprises plural word lines (for example, 1024 word lines) and plural main columns of memory cells (for example, 512 columns). That is, each sector illustrated in FIG. 1 has a capacity of 0.5M bits. The main columns are divided into 16 input/output blocks 111 (hereinafter, referred to as "an I/O block") so as to correspond to 16 input/output pins I/O0–I/O15 (hereinafter, referred to as "an I/O pin"), respectively. Each of the I/O blocks 111 is comprised of two bit segments (or even- and odd-numbered bit segments) 112_0 and 112_1, each of which has 16 columns (that is, bit lines) of main memory cells (not shown).

A first column selector 120 receives first decoding signals YA0–YA15 and selects one of the main columns in each bit segment $112\_0$ $_{and}$ $112\_1$ in response thereto. A second column selector 130 receives second decoding signals YB0 and YB1 and selects either one of the bit segments 112_0 and 112_1 in the respective I/O blocks 111 in response thereto. That is, through the first and second column selectors 120 and 130, there is selected one column of either one of the two bit segment 112_0 and 112_1 in each I/O block 111. In the preferred embodiment, to select one of the main columns in the respective I/O blocks 111, five bits of column addresses are used which, for example, consist of A10, A11, A12, A13, and A14. The address signals A10–A13 are used to select one column of the respective bit segments 112_0 and 112_1, and the address signal A14 is employed to select one of the two bit segments 112_0 and 112_1, which correspond to the respective I/O blocks 111, respectively.

As illustrated in FIG. 2, the sector 100a–d a further comprises a redundancy memory cell array 140, which has eight redundant columns RC0–RC7 of redundant memory cells. Herein, the redundancy memory cell array 140 and the main memory cell array 110 share the same word lines. The eight redundant columns RC0–RC7 are divided into two redundancy blocks 141_0 and 141_1, each of which consists of two redundant bit segments 142_0 and 142_1. The eight redundant columns RC0–RC7 are connected to a third column selector 150. The third column selector 150 selects even- or odd-numbered ones of the redundant columns RC0–RC7 in response to third decoding signals YR0 and YR1. The decoding signal YR0 has the same state as the address signal A10 (that is, a least-significant bit (LSB) of the column addresses), and the decoding signal YR1 has the same state as the complementary signal $\overline{A10}$ to the address signal A10. For example, when the address signal A10 is at a low level, the signals YR0 and YR1 become a low level and a high level, respectively. As a result, since NMOS transistors MN6, MN8, MN10, and MN12 in the third column selector 150 are turned on by means of the signal YR1 there are selected odd-numbered redundant columns RC1, RC3, RC5, and RC7.

Then, a fourth column selector 160 selects one of the redundant bit segments 142_0 and 142_1 in the respective blocks 141_0 and 141_1 in response to the second decoding signals YB0 and YB1 used in selecting one of two bit segments 112_0 and 112_1 in each I/O block 111. That is, one main column in the respective I/O blocks 111 is selected by use of the 5 bit addresses A10–A14, and one redundant column in the respective redundancy blocks 141_0 and 141_1 is simultaneously selected using the second and third decoding signals YB0, YB1, YR0 , and YR1.

The sector 100a–d has 16 sense amplifiers 170 each corresponding to the I/O pins I/O0–I/O15, and the sense amplifiers 170 sense and amplify through corresponding data lines DL0–DL15 data in main memory cells associated with selected row (word line) and main columns (bit lines), respectively. In the sector 100a–d, two sense amplifiers 170 for the redundancy blocks 141_0 and 141_1 are further provided. Outputs from the sense amplifiers 170 each corresponding to the I/O blocks 111 are supplied to corresponding multiplexers 180, respectively. At the same time, outputs from the sense amplifiers 170 each corresponding to the redundancy blocks 141_0 and 141_1 are commonly provided to the multiplexers 180 as illustrated in FIG. 2. Each multiplexer 180 outputs one of data thus provided through corresponding I/O pin to the exterior in response to first and second redundancy selection signals iRS0_i and nRS1_i (i=0–15) from the redundancy selection circuit 200a of FIG. 1. For example, if the redundancy selection signal nRS0_0 corresponding to the I/O0 is activated, the multiplexer 180 outputs data from the sense amplifier 170 connected to the data line DL16. If the redundancy selection signals nRS0_0 and nRS1_0 are inactivated, the multiplexer 180 outputs data from the sense amplifier 170 connected to the data line DL0 to the exterior.

According to the aforementioned configuration, when one main column in each I/O block 111 is selected, first, either odd-numbered ones or even-numbered ones of the redundant columns are chosen by means of a logic level of the address signal A10 of the column addresses A10–A14, which are used to select one main column of the respective I/O blocks 111. Then, one of the redundant bit segments 142_0 and 142_1 in each redundancy block 141_0 and 141_1 is selected by the second decoding signals YB0 and YB1 used in the main memory cell array 110.

As shown in FIG. 1, each of the redundancy selection circuits 200a, 200b, 200c, and 200d is comprised of first and second redundancy flag generators 210 and 220 and first and second redundancy selection signal generators 230 and 240. The first redundancy flag generator 210 and the first redundancy selection signal generator 230 correspond to the even-numbered redundancy block 141_0, and act as a first redundancy block selector. The second redundancy flag generator 220 and the second redundancy selection signal generator 240 correspond to the odd-numbered redundancy block 141_1, and act as a second redundancy block selector. For the ease of description, constituent elements of one redundancy selection circuit 200a corresponding to the mat 100a will be described below, but the others 200b–200d are capable of being configured equally to that.

Figure 3:
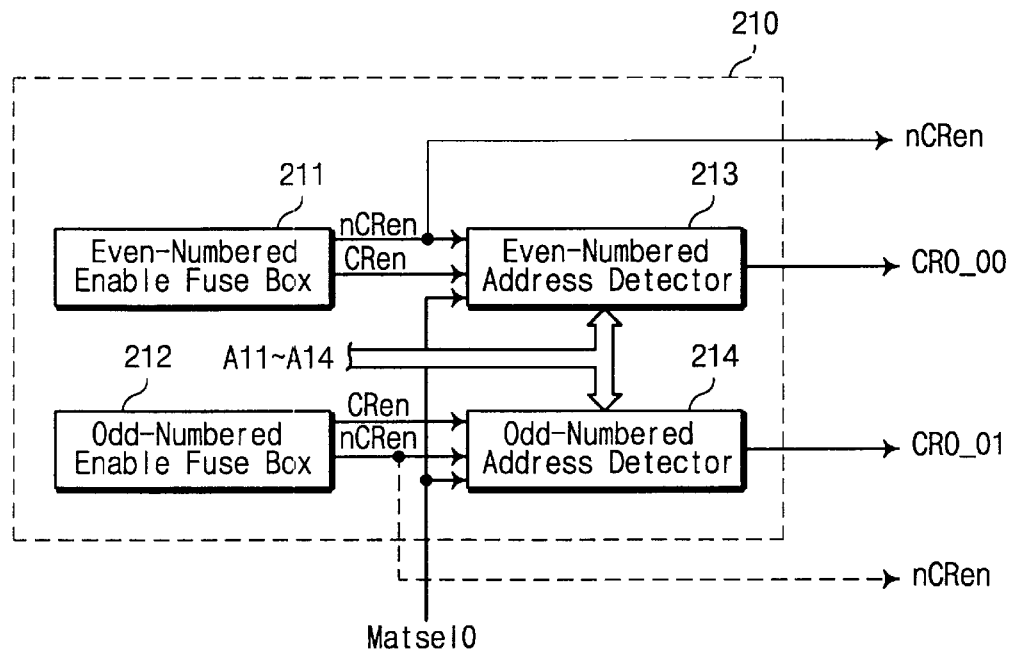
FIG. 3 is a block diagram showing a redundancy flag generator according to a preferred embodiment of the present invention.
Figure 3:
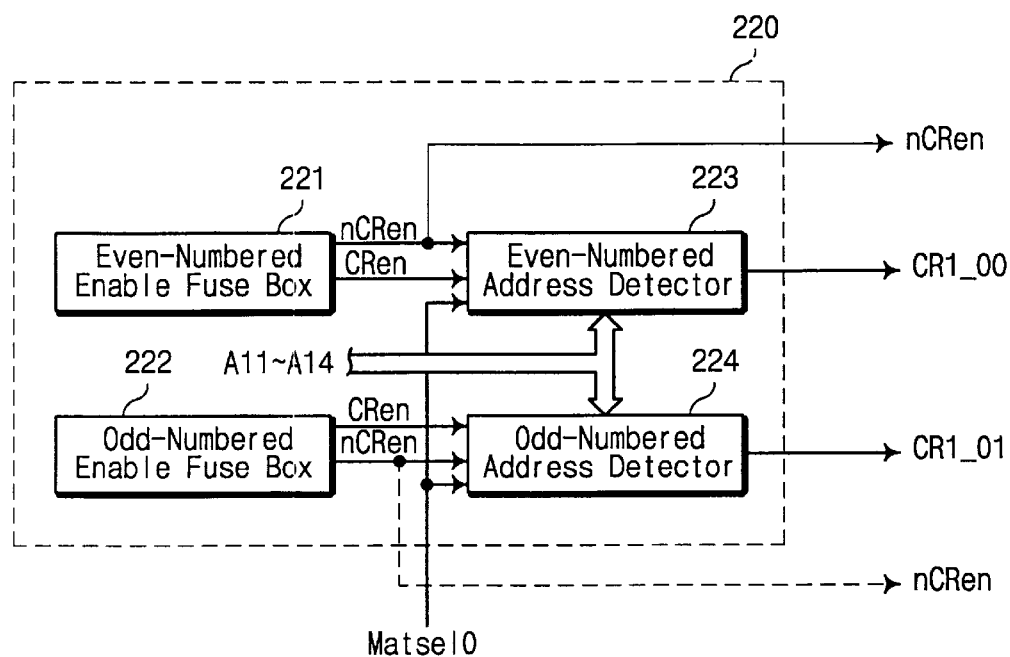

Block diagrams of the first and second redundancy flag generators 210 and 220 are depicted in FIG. 3. Referring to FIG. 3, the first redundancy flag generator 210 is comprised of oven-numbered and odd-numbered enable fuse boxes 211 and 212, and even-numbered and odd-numbered address detectors 213 and 214. For the ease of description, a detailed circuit of one enable fuse boxes 211 is depicted in FIG. 4, but the others may also be constituted equally to the one.

Figure 4:
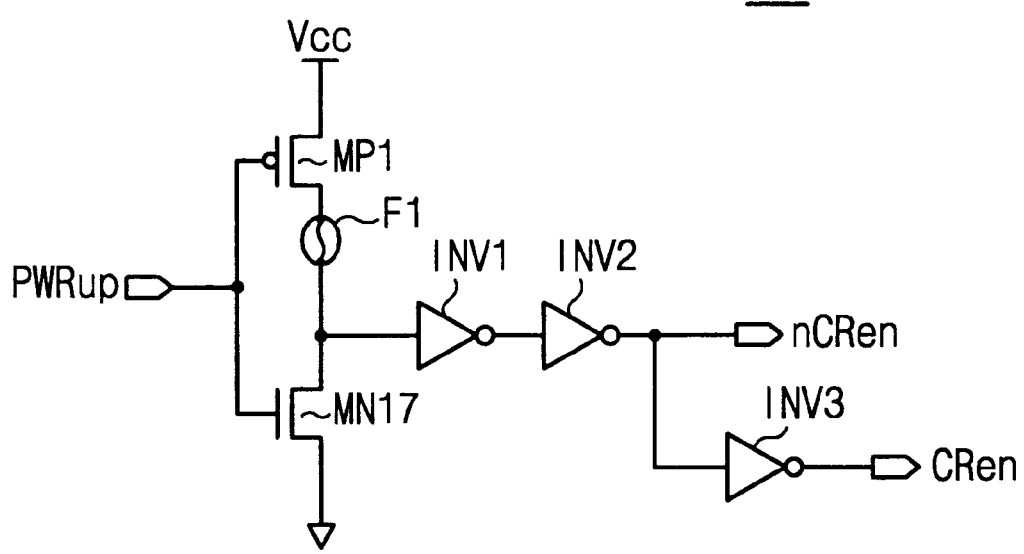
FIG. 4 is a detailed circuit diagram of an enable fuse box according to a preferred embodiment of the present invention.

The enable fuse box 211 consists of a PMOS transistor MP1, an NMOS transistor MN17, an enable fuse F1, and three invertors INV1, INV2, and INV3 connected as shown in FIG. 4. When the fuse F1 is open-circuited, the enable fuse box 211 responds to a signal PWRup and generates signals CRen and nCRen, which have a high level and a low level, respectively. On the other hand, when the fuse F1 is short-circuited, the enable fuse box 211 responds thereto and generates the signals CRen and nCRen, which have the low level and the high level, respectively. That the signals CRen and nCRen become high and low levels respectively means that there is required an operation of repairing defective column(s) in a selected mat. The signal PWRup is generated from a power-on reset circuit well known to ones of ordinary skill in the art. That is, the signal PWRup follows a power supply until the power supply reaches a predetermined level, and becomes the low level when it exceeds the predetermined level.

Figure 5:
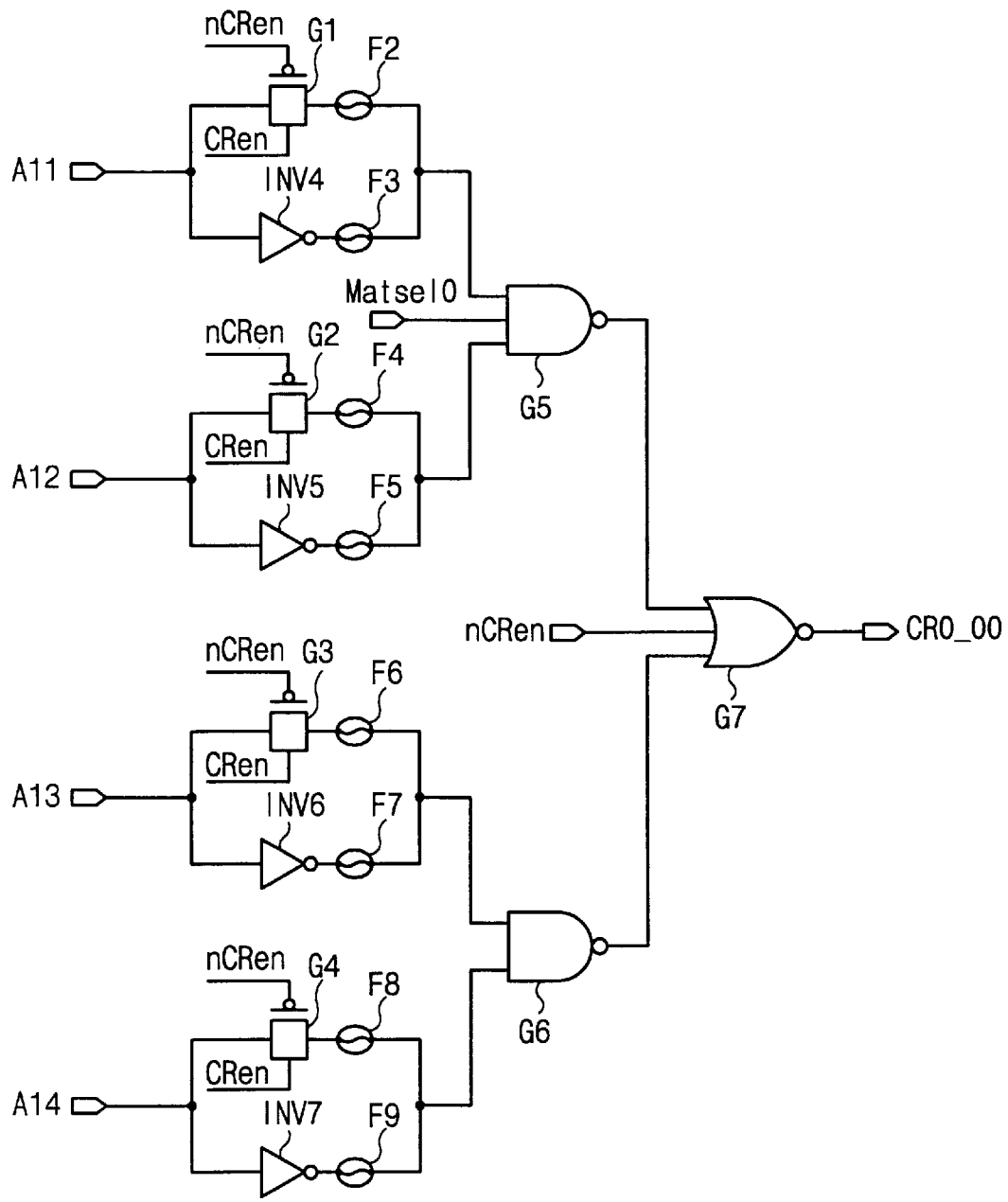
FIG. 5 is a detailed circuit diagram of an address detector according to a preferred embodiment of the present invention.

A detailed circuit diagram of one address detector 213 is illustrated in FIG. 5, but the others may also be constituted equally to the one. Each of the address detectors in the redundancy selection circuits is activated only when corresponding mat selection signal is enabled.

Referring to FIG. 5, the even-numbered address detector 213, which is configured as shown in FIG. 5, responds to a mat selection signal MatselO of the high level and the signals CRen and nCRen of high and low levels from even-numbered enable fuse box 211, and then detects whether column addresses A11–A14 but a column address A10 indicate a detective column of main memory cells. If not, a redundancy flag signal CR0_00 becomes the low level. Otherwise, the redundancy flag signal CR0_00 does the high level.

For example, if column addresses A11–A14 related to the detective column of main memory cells are "1000", fuses F3, F4, F6, and F8 becomes open-circuited in order to store the column addresses A11–A14. When the signals CRen and nCRen become high and low levels, respectively, each of NAND gate circuits G5 and G6 outputs the low level, so that the redundancy flag signal CR0_00 from a NOR gate circuit G6 becomes the high level.

The second redundancy flag generator 220 is configured and operated equally to the first redundancy flag generator 210 having the aforementioned circuits 211, 212, 213 and 214, and description of the second redundancy flag generator 220 is thus omitted.

Figure 6:
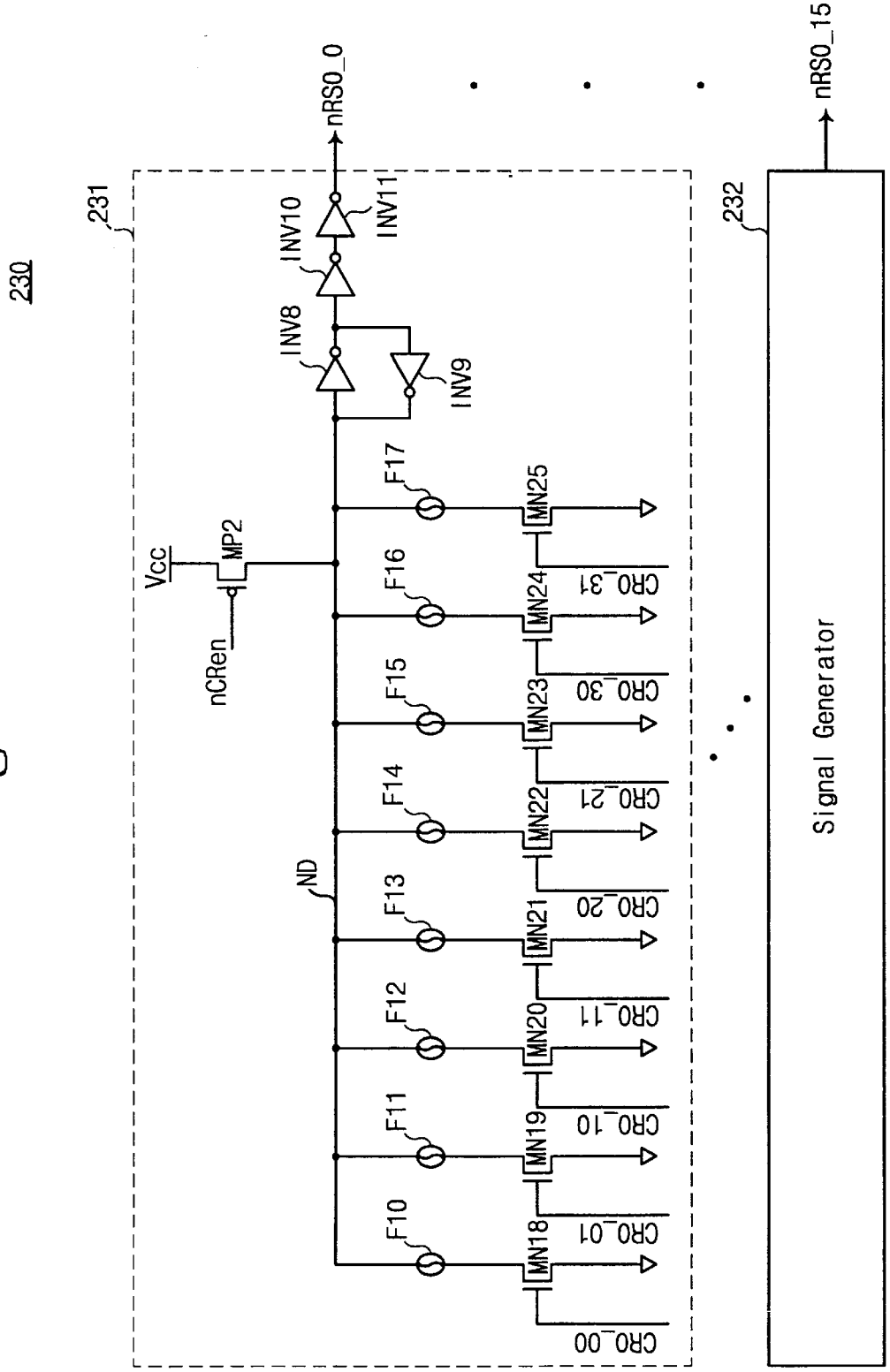
FIGS. 6 and 7 are a detailed circuit diagram of redundancy selection signal generators according to a preferred embodiment of the present invention.

FIG. 6 is a circuit block diagram showing a first redundancy selection signal generator 230 in each redundancy selection circuit 200a–200d. The first redundancy selection signal generator 230 is comprised of a first plurality of signal generators 231–232 each for producing corresponding redundancy selection signals nRS0_i (i=0–15), respectively. Only one detailed circuit associated with one of the signal generators 231–232 is illustrated in FIG. 6, but it is obvious to ones of ordinary skill in the art that the others are made equally to the one.

Referring to FIG. 6, to generate a redundancy selection signal nRS0_0, the signal generator 231 is composed of eight fuses F10–F17, a PMOS transistor MP2 having a current path formed between a power supply voltage Vcc and a node ND commonly connected to one ends of the fuses F10–F17 and receiving the signal nCRen from the first redundancy flag generator 210, eight NMOS transistors MN18–MN25, four invertors INV8–INV11. Each of the NMOS transistors M18–M25 has a current path formed between the other end of corresponding fuse and a ground. To gates of the NMOS transistors M18–M25, redundancy flag signals CR0_00–CR0_31 are applied respectively in that order. The signals CR0_00–CR0_31 are outputted from the first redundancy flag generator 210 in each redundancy selection circuit 200a–200d, as shown in FIG. 1.

For example, assume that the node ND is at a low level by use of any reset circuit (although not shown, an NMOS transistor switched on/off by a reset signal). This forces the redundancy flag signal NRS0_0 to go high through the inverters INV8, INV10, and INV11. The high level of the signal NRS0_0 is latched through the inverters INV8 and INV9. In this condition, if the signal nCRen becomes the low level, the node ND goes high through the PMOS transistor MP2. The redundancy flag signals CR0_10–CR0_11 becomes the low level because mat selection signals Matsel1–Matsel3 are inactivated. As expressed above, when the mat selection signal Matsel0 is activated under the condition (that is, in case that defective column addresses A11–A14 are "1000"), the redundancy flag signal CR0_00 goes the high level, so that the node ND becomes the low level through transistor MN18 and the redundancy selection signal nRS0_0 does the high level. Therefore, in order to enable the signal nRS0_0, the fuse F10 only has to be open-circuited.

Figure 7:
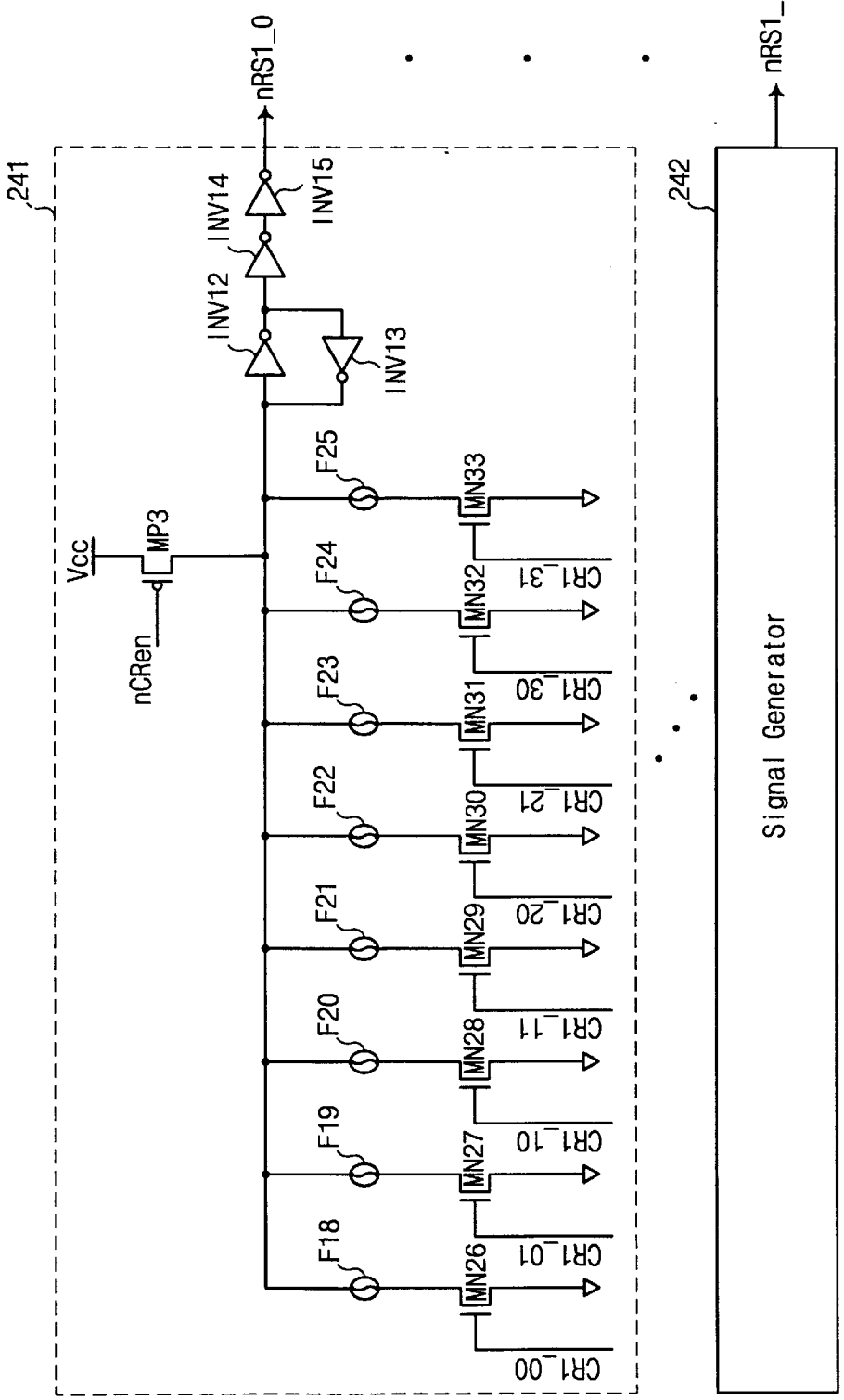

FIG. 7 is a circuit diagram showing a second redundancy selection signal generator. The constituent elements of FIG. 7 equal to those of FIG. 6, and description thereof is thus omitted.

Figure 8:
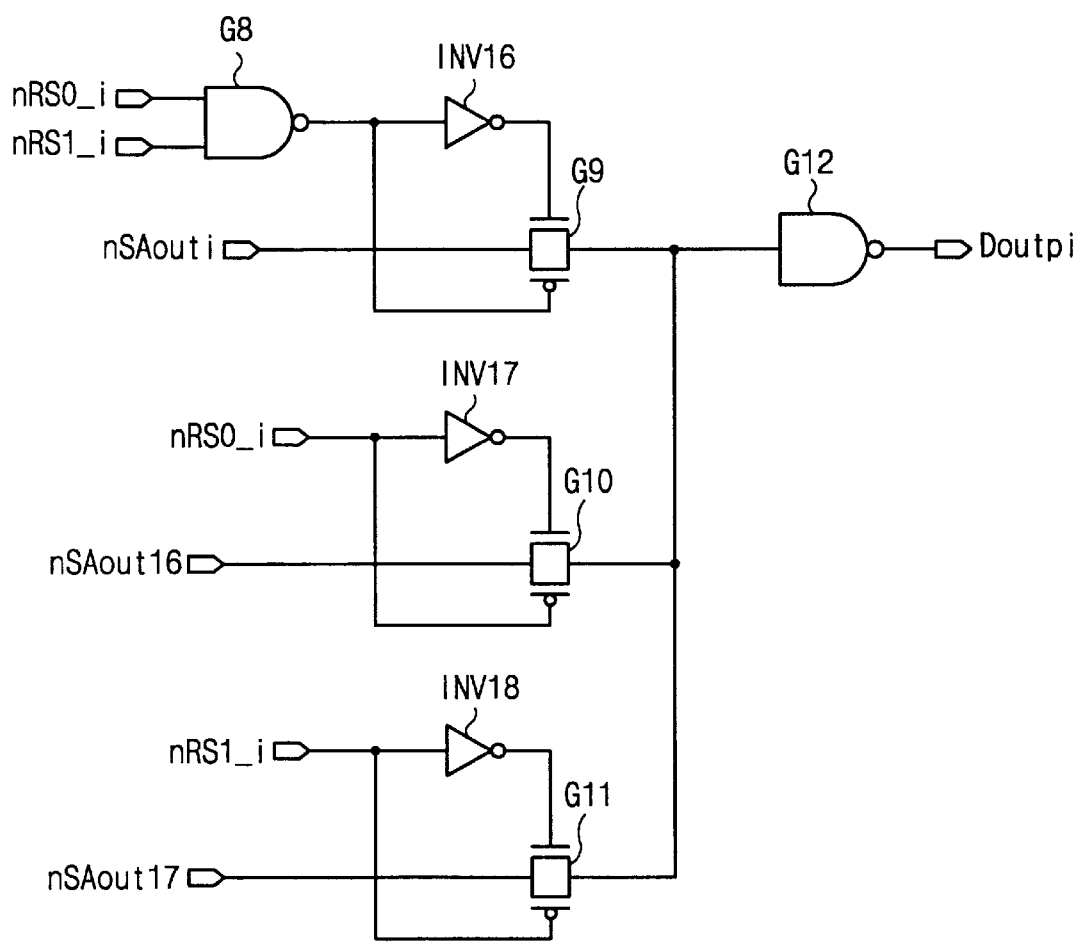
FIG. 8 is a circuit diagram of a multiplexer for reading according to the preferred embodiment of the present invention.

FIG. 8 is a circuit diagram of an i-th multiplexer 180 for reading according to the preferred embodiment of the present invention. It is obvious that the others are also constituted equally to that. As illustrated in FIG. 8, the i-th multiplexer 180, which is configured as in FIG. 8, receives data from a sense amplifier corresponding to an i-th I/O block, data nSAout16 from a sense amplifier corresponding to the even-numbered redundancy block 141_0, and data nSAout17 from a sense amplifier corresponding to the odd-numbered redundancy block 141_1. And then, the multiplexer 180 outputs one of the data thus received in response to corresponding redundancy selection signals nRS0_i and nRS1_i. For example, when the redundancy selection signal nRS0_i is at the low level, data nSAout16 only is outputted through gate circuits G10 and G12 as its output Doutputi. If the signals nRS0_i and nRS1_i goes high, the multiplexer 180 outputs the data nSAouti through gate circuits G9 and G12.

Figure 9:
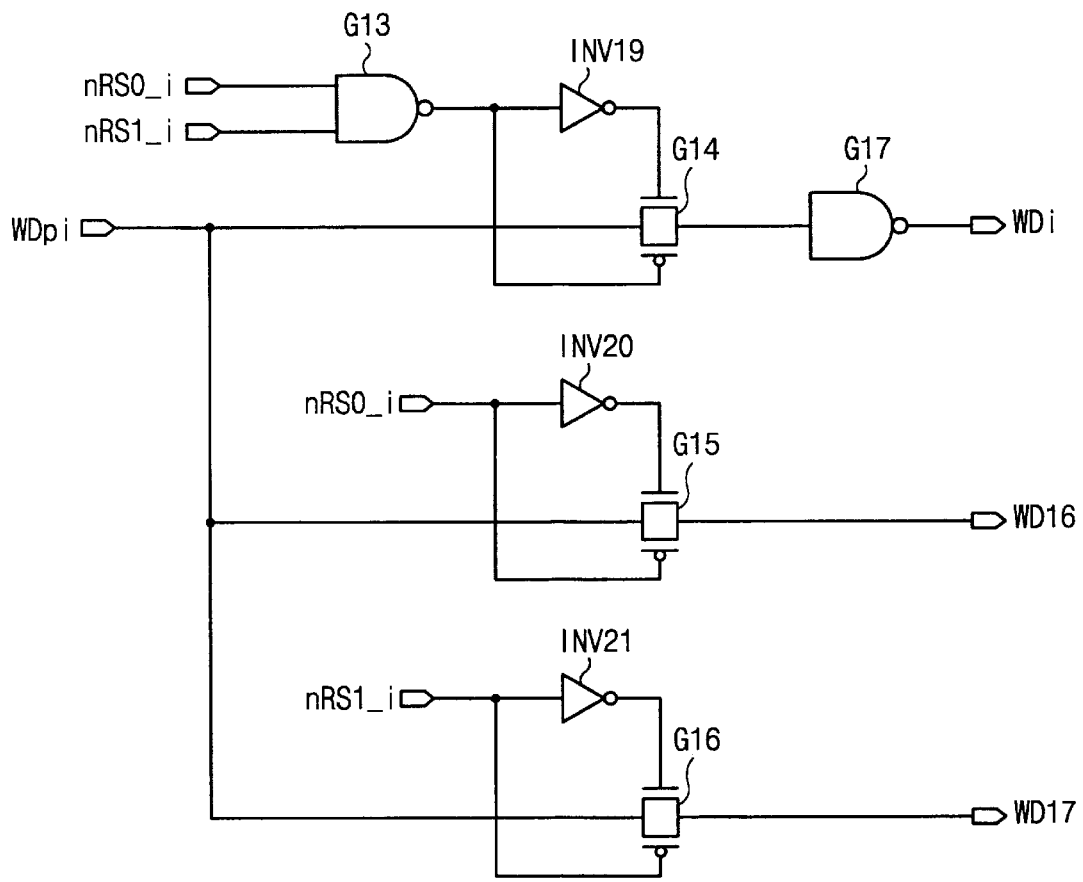
FIG. 9 is a circuit diagram of a multiplexer for writing according to the preferred embodiment of the present invention.

FIG. 9 is a circuit diagram of an i-th multiplexer 180 for writing according to the preferred embodiment of the present invention. It is obvious that the others are also constituted equally to that. As illustrated in FIG. 9, the i-th multiplexer 180, which is configured as in FIG. 9, receives an externally provided data WDpi, and supplies with the data WDpi a sense amplifier corresponding to one of the i-th I/O block 111, the even-numbered redundancy block 141_0, and the odd-numbered redundancy block 141_1 in response to first and second redundancy selection signals nRS0_i and nRS1_i. For example, when the redundancy selection signal nRS0_i is at the low level, the data WDpi is transferred through gate circuit G15 to a sense amplifier corresponding to the even-numbered redundancy block 141_0. If the signals nRS0_i and nRS1_i goes high, the data WDpi is transferred through gate circuits G14 and G17 to a sense amplifier corresponding to the i-th I/O block 111.

An operation of repairing defective column(s) of main memory cells will be described below with reference to FIGS. 1 through 9. Assume that a sector #0 of a mat 100a is selected and there are short-circuited two main columns adjacent to each other which are disposed in even-numbered bit segment 112_0 corresponding to a first I/O pin I/O0. That is, the two main columns are defective columns. One of the short-circuited main columns is assigned using column addresses A10–A14 of '01000', and the other thereof is assigned using column addresses A10–A14 of '11000'. After one word line is selected, an operation for repairing the defective main column of '01000' will be performed as follows. A column selecting operation and a redundancy selection signal generating operation will be described below sequentially, although the operations are simultaneously performed.

First, the operation for selecting the column will be expressed below. By decoding the column addresses A10–A13 of '0100' at a previous stage (for example, a column decoding circuit), a first decoding signal YA2 goes high, so that one main column (hereinafter, referred to as "MBL2") of each bit segment 112_0 and 112_1 is selected. At the same time, a second decoding signal YB1 goes high through the previous stage, because an address signal A14 is at a low level (that is, '0'). So, NMOS transistors MN2, . . . , MN4 of the second column selector 130 are simultaneously turned on. This means that there is selected odd-numbered one of the bit segments 112_0 and 112_1 of each I/O block 111. And then, sense amplifiers 170 each connected to data lines DL0–DL15 sense and amplifier data in memory cells arranged in intersections of the selected word line and the selected main column MBL2 of each I/O block 110. For example, the sense amplifier 170 connected to the data line DL0 sense and amplifier data in memory cell associated with the selected word line and the selected main column MBL2 of the odd-numbered bit segment 112_1.

At the same time as a data reading (sensing and amplifying) operation for the main memory cell array is performed, a data reading operation for the redundancy memory cell array is also made. It is achieved as follows. Since the address signal A10 is at a low level, that is, '0', the third decoding signals YR0 and YR1 goes low and high, respectively, so that NMOS transistors MN6, MN8, MN10, and MN12 in the third column selector 150 are switched on. In the fourth column selector 160, NMOS transistors MN14 and MN16 are turned on. This is because the fourth column selector 160 is controlled in common by means of the address signal A14 of a logically low level, that is, YB0 and YB1, used in selecting either of even- and odd-numbered bit segments 112_0 and 112_1 of each I/O block 11. As a result, odd-numbered redundant columns RC3 and RC7 of the odd-numbered redundancy bit segments 142_1 are selected through the third and fourth column selectors 150 and 160. Sense amplifiers 170 each connected to the data lines DL16 and DL17 sense and amplifier data in redundant memory cells arranged in intersections of the selected word line and the selected redundant columns RC3 and RC7.

Below, the operation for generating the redundancy selection signal will be described in detail. Only a mat selection signal MatselO becomes the high level and other mat selection signals Matsel1–Matsel3 become the low level. This is because the mat 100a is selected. Therefore, a first plurality of redundancy selection signals nRS0_i and a second plurality of redundancy selection signals nRS1_i from redundancy selection circuits 200b–200d are maintained at the high level. And, there are held inactivated states of signals from first and second redundancy flag generators 210 and 220 of the redundancy selection circuits 200b–200d.

First, since odd-numbered bit segment 112_1 is selected (the address signal A14 is a logically low level), a fuse F1 of odd-numbered enable fuse box 212 in the first redundancy flag generator 210 is open-circuited. And, in order to store column addresses A11–A14 of '1000' corresponding to the defective column, fuses F3, F4, F6, and F8 of the odd-numbered address detector 214 are open-circuited. This forces the signals CRen and nCRen from the odd-numbered enable fuse box 212 to go the high level and the low level, respectively, and the redundancy flag signal CR0_01 to go high.

Herein, signals CRen and nCRen from other enable fuse boxes in first and second redundancy flag generators 210 and 220 are inactivated, so that redundancy flag signals CR0_00, CR1_00, and CR1_01 from address detectors therein become the low level (become inactivated). It is obvious to ones of ordinary skill in the art that such a operation as a fuse cut will be made during a wafer level.

As set forth above, since there is generated the defective column MBL2 in the I/O block 111 corresponding to the first I/O pin I/O0, only a redundancy selection signal NRS0_0 has to be activated and other redundancy selection signals nRS0_1–nRS0_15 have to be inactivated. For this, the fuse F10 in the signal generator 231 for generating the redundancy selection signal nRS0_0 becomes open-circuited because one CR0_00 of the redundancy flag signals CR0_00, CR0_1, CR0_10, CR0_11, CR0_20, CR0_21, CR0_30, and CR0_31 applied to the signal generator 231 is at the high level. On the other hand, other signal generators of the first redundancy selection signal generator 230 outputs corresponding signals NRS0_1 through nRS0_15 each having the high level. Redundancy selection signals NRS00_i and nRS10_i (i=0–15) thus generated are transferred into the corresponding multiplexers 180, respectively.

Among the multiplexers 180, one coupled to the first I/O pin I/O0 selects and outputs data from the sense amplifier 170 connected to the data line DL16 in response to the first redundancy selection signal nRS0_0 of the low level and the second redundancy selection signal nRS1_0 of the high level. Other multiplexers 180 output data from the sense amplifiers 170 each connected to the data lines DL1–DL15. That is, one of the short-circuited main columns MBL2 and MBL3 is replaced with redundant column RC3 of the odd-numbered redundant bit segment 142_1 in the redundant block 141_0.

If a main column (hereinafter, referred to as 'MBL3') short-circuited with the main column MBL2 is assigned, it is repaired by use of column information of the main column MBL2 without storing separate column information associated with the main column MBL3. An operation for replacing the main column MBL3 with a redundant column will be described below in detail.

By decoding the column addresses A10–A13 of '1100' related to the main column MBL3, a first decoding signal YA3 goes high, so that one main column MBL3 of each bit segment 112_0 and 112_1 is selected. At the same time, a second decoding signal YB1 goes high, so that the NMOS transistors MN2, . . . , MN4 of the second column selector 130 are simultaneously turned on. This means that there are selected odd-numbered ones of the bit segments 112_0 and 112_1 of each I/O block 111. And then, sense amplifiers 170 each connected to data lines DL0–DL15 sense and amplifier data in memory cells arranged in intersections of the selected word line and the selected main columns MBL3 of the I/O blocks 110, respectively. For example, the sense amplifier 170 connected to the data line DL0 sense and amplifier data in memory cell associated with the selected word line and the selected main column MBL3 of odd-numbered bit segment 112_1.

At the same time as a data reading (sensing and amplifying) operation for the main memory cell array is performed, a data reading operation for the redundancy memory cell array is also made. It is achieved as follows.

Since the address signal A10 is at a high level, that is, '1', the third decoding signals YR0 and YR1 goes high and low, respectively, so that NMOS transistors MN5, MN7, MN9, and MN11 in the third column selector 150 are switched on, and NMOS transistors MN14 and MN16 in the fourth column selector 160 are turned on. As a result, even-numbered redundant columns RC2 and RC6 of the odd-numbered redundancy bit segments 142_1 are selected through the third and fourth column selectors 150 and 160. Sense amplifiers 170 each connected to the data lines DL16 and DL17 sense and amplifier data in redundant memory cells arranged in intersections of the selected word line and the selected redundant columns RC2 and RC6.

In case that two main columns (for example, MBL2 and MBL3) are short-circuited, there is utilized column information of the main column MBL2 without storing separate column information associated with the main column MBL3, so that the redundancy selection signal nRS0_0 of the first redundancy selection signals nRS0_0 through nRS0_15 is activated at the low level according to the aforementioned manner and so that the second redundancy selection signals are inactivated. Accordingly, two main columns MBL2 and MBL3 adjacent to each other are repaired by use of column information associated with the main column MBL2, and vise versa.

In case that different bit segments, that is, even- and odd-numbered bit segments, 112_0 and 112_1 corresponding to the first I/O pin I/O0 have two short-circuited main columns (for example, MBL2 and MBL3) adjacent to each other, fuses both in even-numbered enable fuse box and address detector 211 and 213 and in the first redundancy selection signal generator 230 become open in the same manner as set forth above. This means that redundancy flag signals CR0_00 and CR00_01 become activated, and then does that the first redundancy selection signal nRS0_0 goes high. Under the condition, the operation for sensing and amplifying data in main and redundancy memory cell arrays 110 and 140 equals to that set forth above, and description thereof is thus omitted.

Furthermore, assume that two I/O blocks 111 each corresponding to two different I/O pins (for example, IO0 and IO1) have defective main columns which are generated equally to the aforementioned cases. Defective columns of the I/O block 111 corresponding to the I/O pin I/O1 are repaired according to the same manner as those corresponding to the I/O pin I/O0 above described, and description thereof is thus omitted.

Even though two enable fuse boxes 211 and 212 are made in one redundancy flag generator 210, either thereof is capable of being used in order to inform that a selected mat has to be repaired. And, a redundancy operation for writing will be performed equally to that for reading as described above.

<EFFECT>

According to the present invention, first, the circuit for selecting redundant column(s) instead of a defective column (s) is provided by a mat of plural sectors (well known as an erase unit), while it is implemented on the basis of each sector in a case of the prior art. By using the redundancy scheme of the present invention, the circuit for selecting redundant column is capable of occupying a chip area less than that of the prior device, which has the circuit for selecting redundant column implemented so as to correspond to plural sectors, respectively.

In accordance with such a redundancy scheme, when a selected sector in a selected mat has defective columns of memory cells, the other sectors in the selected mat are repaired in association with the defective columns of the one selector by use of the same redundancy selection circuit. It should be seen that this is useful when each sector has the same defective columns.

Then, according to the redundancy scheme of the present invention, a decoding system for selecting main columns in the main memory cell array is applied to that for selecting redundant columns. This enables two main columns short-circuited and adjacent to each other to be repaired by use of column information representing one of the short-circuited main columns.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:

a mat having a plurality of sectors for storing information, one of the sectors having a main memory cell array that comprises plural word lines and plural column lines, and having a redundancy memory cell array;

a redundancy selection circuit that comprises a plurality of redundancy flag generators and a plurality of redundancy selection signal generators connected to the mat, such that when a selected sector in the mat has defective columns of memory cells, other sectors in the mat are repaired in association with the defective columns of the one sector by use of the same redundancy selection circuit;

wherein said plurality of redundancy flag generators and redundancy selection signal generators comprise fuse means respectively.

2. The semiconductor memory device according to claim 1, wherein said main memory cell array and said redundancy cell array share said word lines.

* * * * *

UNITED STATES PATENT AND TRADEMARK OFFICE
CERTIFICATE OF CORRECTION

PATENT NO. : 6,122,194
DATED : September 19, 2000
INVENTOR(S) : Chung et al.

It is certified that error appears in the above-identified patent and that said Letters Patent is hereby corrected as shown below:

Column 4,
Line 14, "100$a$-d" should read -- 100a_0 --.
Line 28, "112$_{0\ and\ 1121}$ 1" should read -- 112_0 and 112_1 --.
Line 43, "100a-d a" should read -- 100a_0 --.

Column 5,
Lines 9 and 14, "100$a$-$d$" should read -- 100a_0 --.
Line 24, "iRS0_i" should read -- nRS0_i --.

Column 6,
Line 24, "Matse1O" should read -- Matse10 --.

Column 7,
Lines 6 and 8, "NRS0_0" should read -- nRS0_i --.

Column 8,
line 43, "I/O block 11" should read -- I/O block 111 --.

Column 9,
Line 16, "NRS0_0" should read -- nRS0_0 --.
Line 24, "NRS0_i" should read -- nRS0_i --.
Line 25, "NRS00_i" should read -- nRS0_i --.
Line 26, "NRS10_i" should read -- nRS1_i --.

Column 10,
Line 29, "CR00_01" should read -- CR0_01 --.

Signed and Sealed this

Twelfth Day of March, 2002

Attest:

*Attesting Officer*

JAMES E. ROGAN
*Director of the United States Patent and Trademark Office*